(12) United States Patent
Cheng et al.

(10) Patent No.: US 12,392,803 B2
(45) Date of Patent: Aug. 19, 2025

(54) PROBE CARD, METHOD FOR DESIGNING PROBE CARD, METHOD FOR PRODUCING TESTED SEMICONDUCTOR DEVICE METHOD FOR TESTING UNPACKAGED SEMICONDUCTOR BY PROBE CARD, DEVICE UNDER TEST AND PROBE SYSTEM

(71) Applicant: MPI CORPORATION, Zhubei (TW)

(72) Inventors: Yang-Hung Cheng, Zhubei (TW); Yu-Hao Chen, Zhubei (TW); Jhin-Ying Lyu, Zhubei (TW); Hao Wei, Zhubei (TW)

(73) Assignee: MPI CORPORATION, Zhubei (TW)

( * ) Notice: Subject to any disclaimer, the term of this patent is extended or adjusted under 35 U.S.C. 154(b) by 159 days.

(21) Appl. No.: 18/242,586

(22) Filed: Sep. 6, 2023

(65) Prior Publication Data
US 2024/0077519 A1 Mar. 7, 2024

Related U.S. Application Data

(60) Provisional application No. 63/404,522, filed on Sep. 7, 2022.

(51) Int. Cl.
| | |
|---|---|
| *G01R 1/073* | (2006.01) |
| *G01R 1/02* | (2006.01) |
| *G01R 1/04* | (2006.01) |
| *G01R 1/067* | (2006.01) |
| *G01R 31/26* | (2020.01) |
| *G01R 31/28* | (2006.01) |
| *G01R 31/319* | (2006.01) |

(52) U.S. Cl.
CPC ..... *G01R 1/07342* (2013.01); *G01R 1/06772* (2013.01); *G01R 31/2886* (2013.01)

(58) Field of Classification Search
CPC . G01R 1/02; G01R 1/04; G01R 1/067; G01R 1/073; G01R 31/26; G01R 31/28; G01R 31/31; G01R 31/319
See application file for complete search history.

(56) References Cited

U.S. PATENT DOCUMENTS

2017/0003319 A1* 1/2017 Ku .................. G01R 31/31716
2021/0048452 A1* 2/2021 Yang ................. G01R 1/06722

* cited by examiner

*Primary Examiner* — Neel D Shah
(74) *Attorney, Agent, or Firm* — Troutman Pepper Locke LLP; Tim Tingkang Xia, Esq.

(57) ABSTRACT

A probe card, a method for designing the probe card, a method for producing a tested semiconductor device, a method for testing an unpackaged semiconductor by the probe card, a device under test, and a probe system are provided. The probe card includes a wiring substrate, a connection carrier board, and a probe device. At least two probes form a differential pair electrically connected to a loopback line of the connection carrier board to form a test signal loopback path. The probe device has a probe device impedance on the test signal loopback path. The loopback line has a loopback line impedance on the test signal loopback path. A difference between the probe device impedance on the test signal loopback path and the loopback line impedance on the test signal loopback path is in an impedance range.

20 Claims, 13 Drawing Sheets

PROBE CARD, METHOD FOR DESIGNING PROBE CARD, METHOD FOR PRODUCING TESTED SEMICONDUCTOR DEVICE METHOD FOR TESTING UNPACKAGED SEMICONDUCTOR BY PROBE CARD, DEVICE UNDER TEST AND PROBE SYSTEM

CROSS-REFERENCE TO RELATED PATENT APPLICATION

This application claims the benefit of priority to the U.S. Provisional Patent Application Ser. No. 63/404,522, filed on Sep. 7, 2022, which application is incorporated herein by reference in its entirety.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a probe card, a method for designing a probe card, a method for producing a tested semiconductor device, a method for testing an unpackaged semiconductor by a probe card, a device under test, and a probe system, and more particularly to a probe card, a method for designing a probe card, a method for producing a tested semiconductor device, a method for testing an unpackaged semiconductor by a probe card, a device under test, and a probe system that are adapted to a high frequency test.

BACKGROUND OF THE DISCLOSURE

As shown in FIG. 1, a probe card is a transmission interface for transmitting test signals between a test apparatus TH and an electronic device under test (hereinafter referred to as a device under test (DUT)). A probe card PC basically includes a wiring substrate PCB, a connection carrier board ST, and a probe device PD (probe holder PH). The probe device PD (probe holder PH) is electrically connected to and disposed on one side of the connection carrier board ST. The connection carrier board ST is connected to and disposed on one side of the wiring substrate PCB. Furthermore, the connection carrier board ST has a multi-layer stacked structure. In addition, the device under test DUT is formed on the substrate SB. The substrate SB is disposed on a carrier device CHK (such as a chuck).

The connection carrier board ST is provided such that the circuitry in the device under test DUT (e.g., a die) can be electrically connected to the wiring substrate PCB. Therefore, a spatial distribution of contact points on the device under test DUT needs to be enlarged. This process is referred to as space transform.

With the advancement of digital technology, an operation speed and signal transmission volume per second of the device under test DUT are increased day by day, and the frequency of the test signal generated by the processor of the detection device cannot meet a transmission volume of high-frequency test signals as required by the device under test DUT.

Therefore, in order to address the abovementioned problems, the device under test DUT is used to generate the required high-frequency test signals, and then the signals are transmitted back through the probe card PC to the device under test DUT for detection to achieve the purpose of high-frequency testing. This process is referred to as a loopback test. The loopback test includes sending a high-frequency test signal from the device under test DUT, passing the signal through a transmission path, and then returning the signal to the device under test DUT to determine whether or not the device under test DUT works normally. Specifically, the high-frequency test signal is emitted by the device under test DUT, and the high-frequency test signal does not pass through the wiring substrate PCB, but directly passes through a loopback line of the connection carrier board ST before being transmitted back to the device under test DUT to form a loopback test signal circuit that performs a loopback test.

SUMMARY OF THE DISCLOSURE

The aforementioned probe card PC is used to perform a high frequency test on the device under test DUT through the loopback test, and when a test frequency of the high frequency test signal is raised to $1/10$ of a wavelength of the signal being smaller than a length of a loopback line, an impedance mismatch occurs in the loopback test signal circuit, thus negatively impacting a signal integrity.

Generally, a transmission contact (TX) and a receiving contact (RX) on a device under test are designed to be close to each other, so as to obtain a shortest path on a loopback line of the connection carrier board ST. In practice, however, due to considerations in the design of the device under test DUT, the transmission contact (TX) and the receiving contact (RX) cannot be designed to be as close to each other as expected. At this time, the loopback line of the connection carrier board ST needs to be adjusted accordingly and a path (from TX to RX) of the loopback line is extended accordingly. Therefore, when the test frequency of the high frequency test signal is continuously raised (e.g., the high frequency test signal has a Nyquist frequency of greater than or equal to 10 GHz), the status of impedance inconsistency has greater impact on signal integrity.

The greater the test frequency of the high frequency test signal is, the shorter the wavelength of the high frequency test signal is. Therefore, when a test path (i.e., a signal transmission path) has impedance mismatch, an issue of return loss (S11) becomes significant.

In order to solve an issue of poor integrity of signals produced during high frequency tests (e.g., the high frequency test signal has a Nyquist frequency of greater than or equal to 10 GHz) caused by impedance mismatch of a characteristic impedance of the probe device PD (probe holder PH) and a system impedance, the present disclosure addresses the issue of impedance mismatch, that is, improves the characteristic impedance of the probe device PD (probe holder PH).

However, effects of improvements are limited if the improvements are only made to the characteristic impedance of the probe device PD. For example, when a mechanical characteristic of probes in the probe device PD (probe holder PH) is satisfied, by changing a probe length and probe thickness of the probe device PD (probe holder PH), the characteristic impedance of the probe device PD (probe holder PH) is changed. It should be noted that, such manner of improvement has limited effect on the signal integrity. For example, although a thicker probe can improve the return loss, in order to have a same probe force during test, the probe length needs to be greater. That is, an overall signal path length from a probe head/tip to a probe tail becomes longer, thus causing an insertion loss to be poor.

That is, when performing the loopback test using the high frequency test signal, the probe card PC can obtain good signal integrity through impedance matching, and the signal integrity can be determined at least through an eye height opening and/or an eye width opening in an eye pattern/eye diagram. Specifically, characteristic impedances of the wiring substrate PCB, the connection carrier board ST, and the probe device PD (probe holder PH) are designed to match with the system impedance. However, a test quality is affected because the characteristic impedance of the probe device PD (probe holder PH) cannot be adjusted according to user requirements due to limitations of mechanical characteristics and circuitry design of the probe device PD (probe holder PH).

In order to solve the above-mentioned problems, one of the technical aspects adopted by the present disclosure is to provide a probe card (PC) for testing at least one device under test being formed on a substrate (SB), the at least one device under test having a system impedance, and a loopback test being performed on the device under test. The probe card includes a wiring substrate (PCB), a connection carrier board, and at least one probe device. The wiring substrate has a wafer side and a tester side. The wafer side of the wiring substrate and the tester side of the wiring substrate are disposed opposite to each other, and the tester side of the wiring substrate is provided for connecting to a test apparatus. The connection carrier board (ST) has a wafer side and a tester side. The connection carrier board includes at least one loopback path (LBP) that is disposed in the connection carrier board, and the tester side of the connection carrier board is connected to the wafer side of the wiring substrate. The at least one probe device is connected to the wafer side of the connection carrier board, and each of the at least one probe device (PD) includes a plurality of probes. One end of each of the plurality of probes is electrically connected to the connection carrier board, and another end of each of the probe is in electrical contact with the device under test. At least two of the plurality of probes of the at least one probe device form a differential pair, and the differential pair is electrically connected to the loopback line in the connection carrier board to form a test signal loopback path. The at least one probe device has a probe device impedance on the test signal loopback path, the loopback line has a loopback line impedance on the test signal loopback path, a difference between the probe device impedance on the test signal loopback path and the loopback line impedance on the test signal loopback path is in an impedance range, and the loopback line impedance on the test signal loopback path is greater than the system impedance of the device under test.

In order to solve the above-mentioned problems, another one of the technical aspects adopted by the present disclosure is to provide a method for designing a probe card for high frequency tests and applicable to at least one device under test (DUT) and a probe card (PC). The probe card (PC) at least includes a wiring substrate (PCB), a connection carrier board (ST), and at least one probe device (PD). The connection carrier board (ST) includes a loopback line, the at least one probe device (PD) including a plurality of probes, and at least two probes of the at least one probe device are respectively connected to two sides of the loopback line to form a test signal loopback path. The at least one device under test at least performs a loopback test through the probe card (PC). The method includes: providing a probe device impedance (PDI) of the at least one probe device on the test signal loopback path; calculating a loopback line impedance on the test signal loopback path; and adjusting the loopback line impedance on the test signal loopback path based on a plurality of parameters of the loopback line, so as to reduce a difference between the loopback line impedance and the probe device impedance to be in an impedance range.

In order to solve the above-mentioned problems, yet another one of the technical aspects adopted by the present disclosure is to provide a method for producing at least one tested semiconductor device, the semiconductor device being designed for use in an operating environment, and the method includes: providing the abovementioned probe card (PC) or the probe card (PC) designed using the method for designing a probe card for connecting to a test apparatus (TH) to transmit test information, the probe card includes a plurality of probes (PH3), and the probe card (PC) is configured to mechanically and/or electrically contact an unpackaged semiconductor device, so as to transmit a signal to the unpackaged semiconductor device or receive a transmitted signal from the unpackaged semiconductor device; using the plurality of probes to contact the unpackaged semiconductor device; establishing the loopback test; and testing the unpackaged semiconductor device by using the loopback test to simulate a part of the operating environment.

In order to solve the above-mentioned problems, yet another one of the technical aspects adopted by the present disclosure is to provide a method for testing an unpackaged semiconductor device by a probe card (PC), the unpackaged semiconductor device being designed for use in an operating environment, and the method including: providing the abovementioned probe card (PC) or the probe card (PC) designed using the method for designing a probe card for connecting to a test apparatus (TH) to transmit test information, the probe card includes a plurality of probes (PH3), and the probe card (PC) is configured to mechanically and/or electrically contact an unpackaged semiconductor device, so as to transmit a signal to the unpackaged semiconductor device or receive a transmitted signal from the unpackaged semiconductor device; using the plurality of probes to contact the unpackaged semiconductor device; establishing the loopback test; and testing the unpackaged semiconductor device by using the loopback test to simulate a part of the operating environment.

In order to solve the above-mentioned problems, still another one of the technical aspects adopted by the present disclosure is to provide a device under test. The device under test performs a high frequency test using the abovementioned probe card or the probe card designed using the method for designing a probe card, the high frequency test is performed by using a high frequency signal, the high frequency signal has a Nyquist frequency greater than or equal to 10 GHz, and the high frequency test is the loopback test.

In order to solve the above-mentioned problems, still another one of the technical aspects adopted by the present disclosure is to provide a probe system (PSYS) for testing a device under test (DUT) formed on a substrate (SB). The probe system includes a carrier device (CHK), a test apparatus, and a probe card (PC). The carrier device (CHK) is configured to support the substrate (SB). The test apparatus is configured to be electrically connected to the device under test (DUT) to establish a loopback test. The probe card (PC) is mechanically and/or electrically disposed in the test apparatus. The probe card utilizes the abovementioned probe card (PC) or the probe card (PC) designed using the method for designing a probe card. The loopback test is a high frequency test.

Therefore, in the probe card provided by the present disclosure, by adjusting the loopback line in the connection carrier board (i.e., the space transformer), an impact of the impedance mismatch in the loopback test can be effectively reduced. Moreover, in a high frequency test, signal integrity in the loopback test can be effectively improved while ensuring flexibility in designing the probe card.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
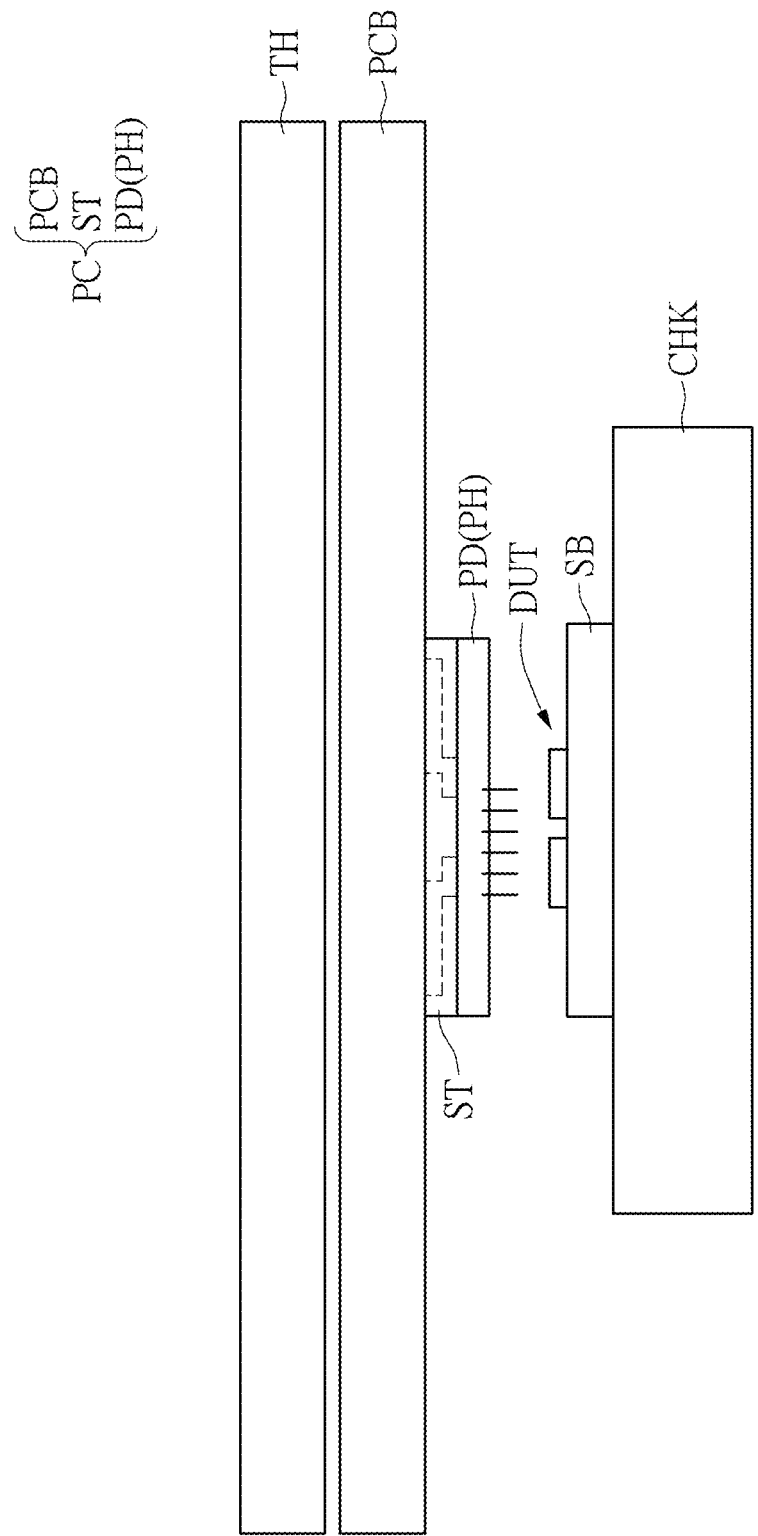
FIG. 1 is a schematic view of a probe card according to a related art.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

First Embodiment

Figure 2:
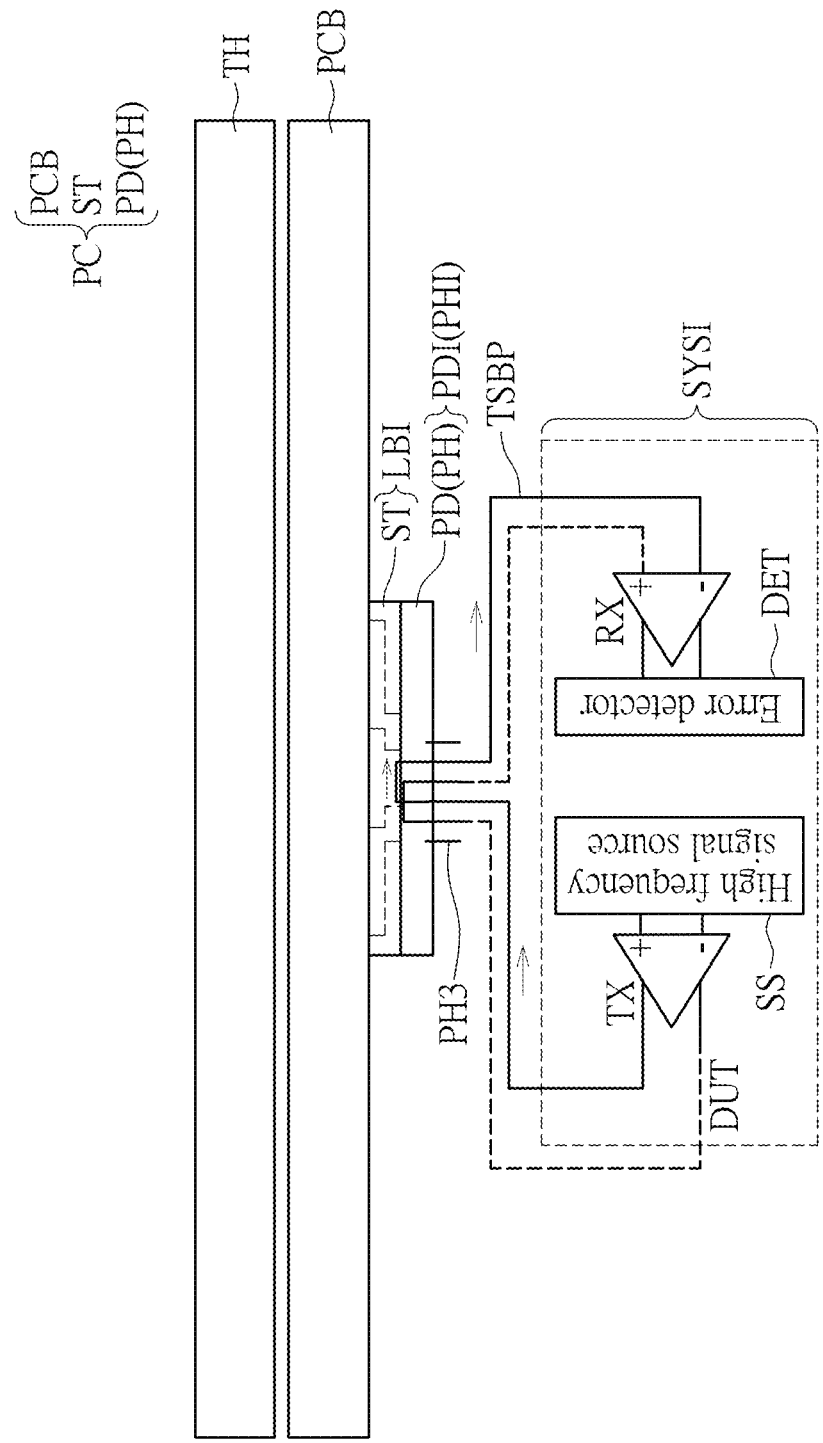
FIG. 2 is a schematic view of a probe card performing a loopback test according to a first embodiment of the present disclosure.
Figure 3:
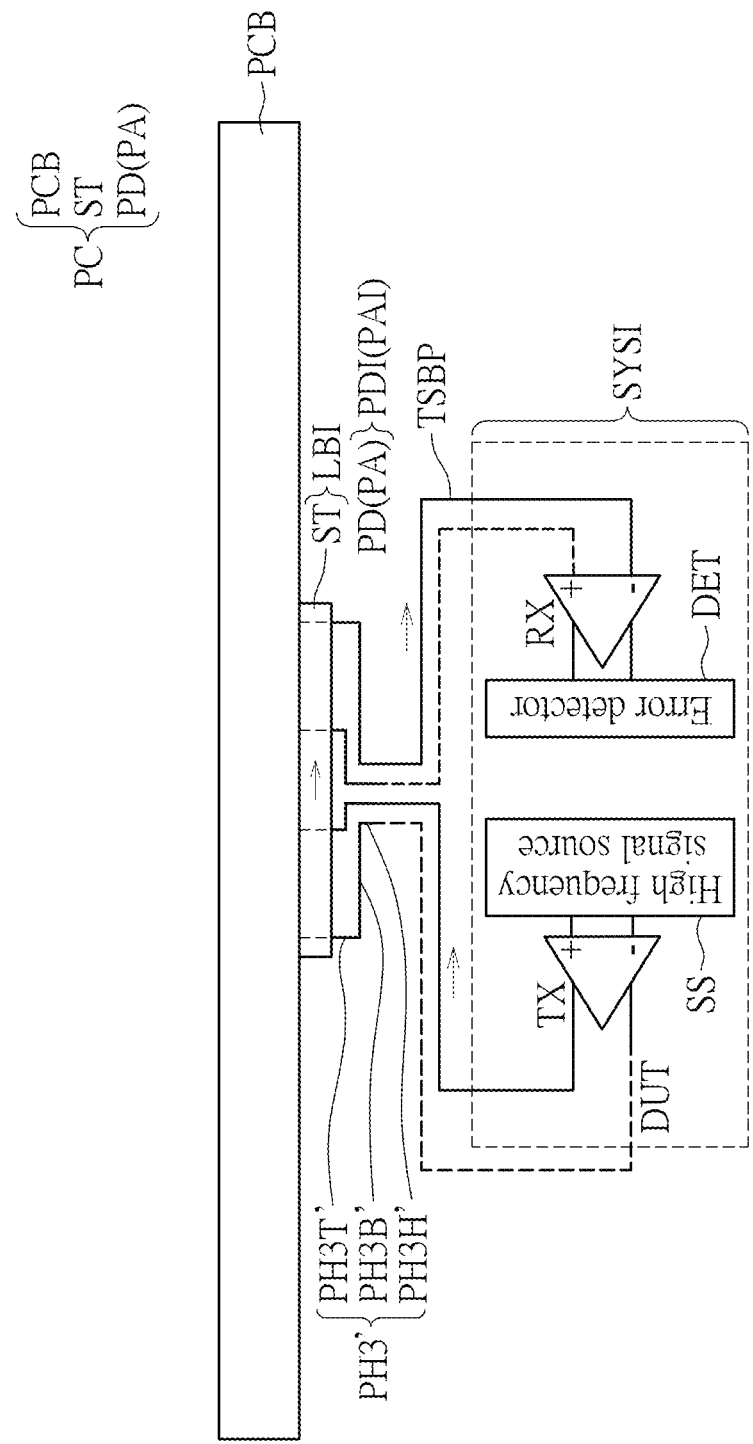
FIG. 3 is another schematic view of the probe card performing the loopback test according to the first embodiment of the present disclosure.
Figure 4:
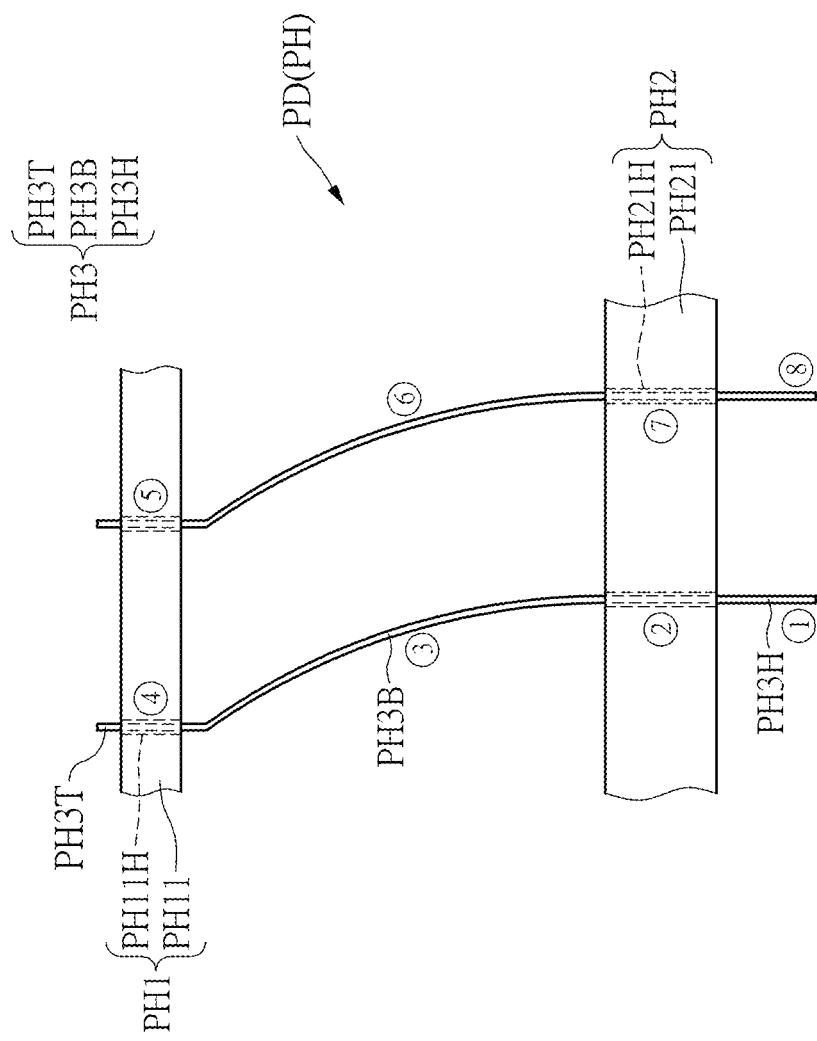
FIG. 4 is a partially enlarged cross-sectional view of a probe device (probe holder) of the probe card according to the first embodiment of the present disclosure.

Referring to FIG. 2, FIG. 3, and FIG. 4, FIG. 2 is a schematic view of a probe card performing a loopback test according to a first embodiment of the present disclosure, the probe card having a probe device PD (probe device PH); FIG. 3 is another schematic view of the probe card performing the loopback test according to the first embodiment of the present disclosure; and FIG. 4 is a cross-sectional view of a probe device PD (probe holder PH) of the probe card according to the first embodiment of the present disclosure, the probe device PD being a probe holder PH of a vertical probe card.

In this embodiment, a probe card PC is provided for being electrically connected to and/or mechanically in contact with a device under test DUT that is a wafer-level circuit. The probe card PC may be configured to test a device under test DUT that is able to be formed on a substrate SB. Examples of the device under test DUT include a semiconductor device, an electronic device, and/or an optoelectronic device. The device under test DUT is formed on a substrate SB. Examples of the substrate SB include wafers, semiconductor wafers, silicon wafers, gallium arsenide wafers, and/or type III-V semiconductor wafers. In certain examples, the device under test DUT may be, for example, a tested semiconductor device and/or an unpackaged semiconductor device.

The device under test DUT has a system impedance that is exemplarily between 80Ω and 100Ω according to various designs. In this embodiment, the system impedance of the device under test DUT is, for example, 92.5Ω. In certain examples, the system impedance of the device under test DUT is an equivalent impedance value viewed from a signal input of the device under test DUT. In this embodiment, the system impedance is measured from the differential pair signal end of the device under test DUT. Specifically, the system impedance is measured from a transmitting end TX and a receiving end RX of the device under test DUT.

Figure 8:
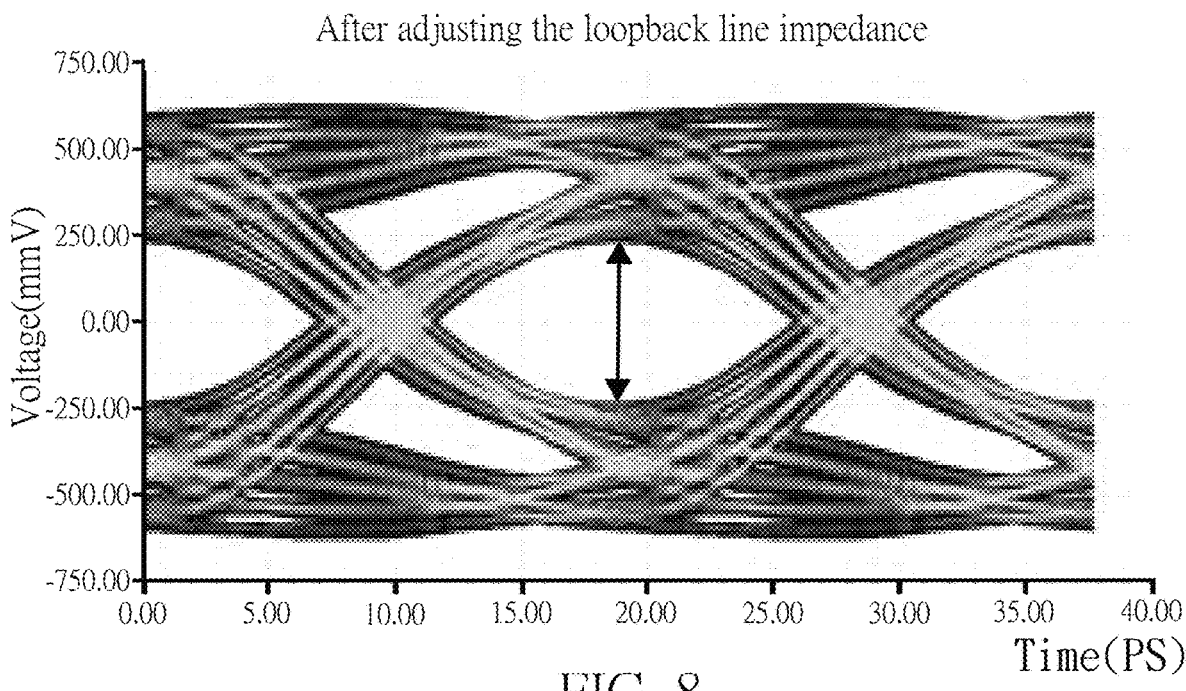
FIG. 8 is an eye diagram of the device under test being tested after adjusting the loopback line impedance of the probe device (probe holder)

As shown in FIG. 2, a test apparatus TH is used to perform various test procedures and/or communicate test information (communicate test information) to the device under test DUT through the probe card PC. The test apparatus TH may be, for example, a test head of a prober. A loopback test is performed in the test apparatus TH, and the loopback test utilizes the device under test DUT to generate the required high frequency test signal. The high frequency test signal passes through the probe card PC and is then transmitted back to the device under test DUT for testing to determine whether or not the device under test DUT functions normally. However, in the loopback test, a loopback line LBP provided by the probe card PC (as shown in FIG. 8) greatly affects a signal integrity of the high frequency test signal. In other words, the higher a frequency of the high frequency test signal is, the shorter the wavelength of the high frequency test signal is, and when impedance mismatch occurs in the signal transmission path or the impedance is not continuous, the distortion of the reflected waves (e.g., an S11 coefficient related to return loss) becomes significant.

As shown in FIG. 2, the probe card PC includes a wiring substrate PCB, a connection carrier board ST, and a probe device PD (probe holder PH).

The wiring substrate PCB has a wafer side and a tester side. The wafer side of the wiring substrate PCB and the tester side of the wiring substrate PCB are disposed opposite to each other, and the tester side of the wiring substrate PCB is provided for being connected to a test apparatus TH. In this embodiment, when the probe card PC is used in the test apparatus TH, the wafer side may be a lower side of the wiring substrate PCB facing the connection carrier board ST and/or may be facing the device under test DUT, and the tester side may be an upper side of the wiring substrate PCB facing the device under test DUT and/or may be facing the test apparatus TH.

The connection carrier board ST also has a wafer side and a tester side. The connection carrier board ST includes at least one loopback line LBP (as shown in FIG. 8). The loopback line LBP is disposed in the connection carrier board ST. It should be noted that the connection carrier board ST may be composed of multiple layers of circuit boards. The tester side of the connection carrier board ST is connected to and disposed on the wafer side of the wiring substrate PCB. In this embodiment, when the probe card PC is used in the test apparatus TH, the wafer side may be a lower side of the connection carrier board ST facing the probe device PD (probe holder PH), and/or facing the device under test DUT, and the tester side may be an upper side of the connection carrier board ST facing away from the device under test DUT, facing the wiring substrate PCB, and/or facing the test apparatus TH.

In this embodiment, the wiring substrate PCB is a general printed circuit board, and the wiring substrate PCB has a top surface (not shown in the figures), a bottom surface (not shown in the figures), and a plurality of signal lines (not shown in the figures) located inside the wiring substrate PCB. Contact pads are formed on the top surface (not shown in the figures) and the bottom surface (not shown in the figures) of the wiring substrate PCB for being electrically connected with the signal lines (not shown in the figures). Pogo pins of the test apparatus TH abut against the contact pads on the top surface (not shown in the figures) of the wiring substrate PCB. Test signals of the test apparatus TH may be transmitted to the bottom surface (not shown in the figures) of the wiring substrate PCB via the aforementioned signal lines (not shown in the figures).

In this embodiment, the connection carrier board ST includes a multilayer organic (MLO) carrier board or a multilayer ceramic (MLC) carrier board, and a material of the connection carrier board ST can be adjusted according to practical requirements and is not limited in the present disclosure. The connection carrier board ST has a plurality of signal lines therein, and contact pads are formed on a top surface and a bottom surface of the connection carrier board ST to be electrically connected to the signal lines inside of the connection carrier board ST. A distance between the contact pads on the top surface is greater than a distance between the contact pads on the bottom surface. The connection carrier board ST is mechanically and electrically connected to the wafer side of the wiring substrate PCB, i.e., the bottom surface of the wiring substrate PCB, and is located below the wiring substrate PCB. Therefore, the contact pads on the top surface of the connection carrier board ST can be electrically connected to the contact pads on the bottom surface of the wiring substrate PCB, such that the signal lines inside the connection carrier board ST are electrically connected to the signal lines of the wiring substrate PCB (not shown in the figures). It should be noted that a carrier board (e.g., a padded board) may be provided between the connection carrier board ST and the wiring substrate PCB such that the connection carrier board ST is mechanically and/or electrically connected to the wafer side of the wiring substrate PCB in an indirect manner.

The probe device PD (probe holder PH) may be mechanically and/or electrically connected to the wafer side of the connection carrier board ST. As shown in FIG. 3, the probe device PD is in the form of a probe holder PH, and the probe device PD (probe holder PH) includes an upper guide plate member PH1, a lower guide plate member PH2, and a plurality of probes PH3. The upper guide plate member PH1 includes at least one upper guide plate PH11. Furthermore, the at least one upper guide plate PH11 has a plurality of upper through holes PH11H formed thereon.

The lower guide plate member PH2 includes at least one lower guide plate PH21. Furthermore, the at least one lower guide plate PH21 has a plurality of lower through holes PH21H formed thereon. The upper guide plate member PH1 and the lower guide plate member PH2 are disposed opposite to each other. Each of the probes PH3 passes through one of the plurality of upper through holes PH11H and one of the plurality of lower through holes PH21H.

As shown in FIG. 3, each probe PH3 has a probe tail PH3T, a probe head PH3H, and a probe body PH3B located between the probe tail PH3T and the probe head PH3H. The probe tail PH3T of each of the probes PH3 is electrically connected to a connection carrier board ST by passing through a corresponding one of the upper through holes PH11H of the upper guide plate member PH1. The probe head PH3H of each of the probes PH3 is in electrical contact with a device under test DUT. The probe head PH3H of each of the probes PH3 may be configured for electrical and/or contact communication with a corresponding contact pad of the device under test DUT. In certain examples, the term communication refers to that the probe may be configured to transmit a test signal from the probe card PC to the device under test DUT and/or receive a synthesized signal from the device under test DUT.

At least two of the probes PH3 form a differential pair (TX-RX). The differential pair is electrically connected to the loopback line LBP in the connection carrier board ST to form a test signal loopback path. In this embodiment, as shown in FIG. 2, the differential pair is connected to the transmitting end TX and the receiving end RX of the device under test DUT, the transmitting end TX includes two connections TX+ and TX−, and the receiving end RX also includes two connections RX+ and RX−. The transmitting end TX is connected to a high frequency signal source SS, and the receiving end RX is connected to an error detector DET. In a preferred embodiment of the present disclosure, a differential pair is used to transmit differential signals, i.e., two single-ended signal lines (e.g., a P-line and an N-line) are connected to TX+ and RX+, and TX− and RX−, respectively, for simultaneous transmission of signals having the same amplitude of signal voltage but opposite signal phases (one phase is positive and the other phase is negative). In other words, the two signal lines refer to each other, with the P-line referencing the N-line and the N-line referencing the P line, and the P-line and the N-line are ideally reference loops to each other.

As shown in FIG. 3, the probe device PD is in the form of a probe assembly PA, i.e., a cantilevered probe (assembly) formed by a plurality of probes PH3'. Each of the probes PH3' includes a probe tail PH3T', a probe head PH3H', and a probe body PH3B' located between the probe tail PH3T' and the probe head PH3H', i.e., a cantilevered section. The probe tail PH3T' of each of the probes PH3' is electrically connected to the connection carrier board ST. The probe head PH3H' of each of the probes PH3' is in electrical contact with the device under test DUT. The probe head PH3H' of each of the probes PH3' may be configured for electrical and/or contact communication with a corresponding contact pad of the device under test DUT. In certain examples, the communication refers to that the probe may be configured to transmit a test signal from the probe card PC to the device under test DUT and/or receive a synthesized signal from the device under test DUT. In one embodiment, each of the probes PH3' is formed on a contact pad attached to the connection carrier board ST through an MEMS process. The cantilevered section extends in a horizontal direction (relative to a vertical direction when the probe detects the device under test) and/or extends in a scrubbing direction (the probe head scrapes off an oxide layer on a surface of the contact pad of the device under test) of the probe PH3'.

The device under test DUT undergoes a loopback test at least through the probe card PC. The loopback test uses a high-frequency test signal provided by the device under test DUT, the signal passes through at least one probe (TX+, TX−) of the aforementioned differential pair, the probe device PD (probe holder PH, probe assembly PA), the loopback line LBP of the connection carrier board ST, and at least one other probe (RX+, RX−), and is then transmitted back to the device under test DUT for testing the device under test DUT. The loopback line LBP is connected between a probe tail PH3T of at least one probe PH3 at the transmitting end TX and a probe tail PH3T of at least one other probe PH3 at the receiving end RX. Furthermore, each of the probes of the probe device PD (probe holder PH, probe assembly PA) has a probe length greater than or equals to 3 mm. When the probe length of each probe is greater than or equal to 3 mm, that is, when the probe length of the differential pair of probes is greater than or equal to 3 mm, the impedance generated by the real probe lengths (the sum of lengths of the probe head, the probe body, and the probe tail) of the differential pair of probes increases with the increase of the test frequency (e.g., when the test signal has the Nyquist frequency of 10 GHz or more). Therefore, the impact of the impedance of the probe on the signal integrity becomes greater such that the impedance of the loopback line on the loopback path of the test signal needs to be designed to match the impedance of the loopback line.

The probe device PD has a probe device impedance PDI on the test signal loopback path. When the probe device PD is in the form of a probe holder PH, the probe holder PH has a probe holder impedance PHI on the test signal loopback path (as shown in FIG. 2). At this time, the probe device impedance PDI is the probe holder impedance PHI. When the probe device PD is in the form of probe assembly PA, the probe assembly PA has a probe assembly impedance PAI (PA Impedance) on the test signal loopback path (as shown in FIG. 3). At this time, the probe device impedance PDI is the probe assembly impedance PAI.

Furthermore, as shown in FIG. 2, the loopback line LBP has a loopback line impedance LBI on the test signal loopback path TSBP, a difference between the probe device impedance PDI (probe holder impedance PHI) on the test signal loopback path TSBP and the loopback line impedance LBI on the test signal loopback path TSBP is in an impedance range, and the loopback line impedance LBI on the test signal loopback path TSBP is greater than a system impedance SYSI of the device under test DUT (in this embodiment, for example, the aforementioned system impedance of 92.5Ω is labeled as the system impedance SYSI in FIG. 2). In certain examples, the system impedance SYSI of the device under test DUT may be between 85 ohms and 100 ohms.

In addition, the impedance range may be, for example, between 0 ohms and 200 ohms. That is, the difference between the probe device impedance PDI (probe holder impedance PHI) on the test signal loopback path TSBP and the loopback line impedance LBI on the test signal loopback path TSBP is greater than 0 ohms and less than 200 ohms.

Furthermore, the probe device impedance PDI (probe holder impedance PHI) on the test signal loopback path TSBP is greater than the loopback line impedance LBI on the test signal loopback path TSBP.

In this embodiment, a Nyquist frequency of the high frequency test signal is greater than or equal to 10 GHz, and the Nyquist frequency is half of a sampling frequency of a discrete signal system.

Furthermore, a path length of the loopback line LBP is greater than a predefined length value, the predefined length value being 700 μm.

In addition, at least two probes form a differential pair. Certain specifications are set for disposing the probes PH3 of the differential pair. The at least two probes have a pitch therebetween. The path length of the loopback line LBP is greater than five times a length of the pitch between the at least two probes. In certain examples, the pitch between the at least two probes is 130 μm.

Referring to FIG. 4, when the probe device PD is in the form of a probe holder PH, the probe device impedance PDI is the probe holder impedance PHI. The probe holder impedance PHI includes an impedance value of the probe head PH3H of the at least one probe PH3 at the transmitting end (TX+, TX−) (corresponding to symbol ①), an impedance value of the lower through hole PH21H through which the at least one probe PH3 passes at the transmitting end (TX+, TX−) (corresponding to symbol ②), an impedance value of the probe body PH3B of the at least one probe PH3 at the transmitting end (TX+, TX−) (corresponding to symbol ③), an impedance value of the probe tail PH3T of the at least one probe PH3 at the transmitting end (TX+, TX−) (corresponding to symbol ④), an impedance value of the upper through hole PH11H through which the at least one probe PH3 passes at the transmitting end (TX+, TX−) (corresponding to symbol ④), an impedance value of the upper through hole PH11H through which the at least one other probe PH3 passes at the receiving end (RX+, RX−) (corresponding to symbol ⑤), an impedance value of the probe tail PH3T of the at least one other probe PH3 at the receiving end (RX+, RX−) (corresponding to symbol ⑤), an impedance value of the probe body PH3B of the at least one other probe PH3 at the receiving end (RX+, RX−) (corresponding to symbol ⑥), an impedance value of the lower through hole PH21H through which the at least one other probe PH3 passes at the receiving end (RX+, RX−) (corresponding to symbol ⑦), and an impedance value of the probe head PH3H of the at least one other probe PH3 at the receiving end (RX+, RX−) (corresponding to symbol ⑧). The sequence of the description is described in terms of the test signal loopback path TSBP including the high frequency test signal passing from the transmitting end (TX+, TX−) through the probe PH3 (the at least one probe) of the transmitting end (TX+, TX−), the loopback line LBP, the probe PH3 (the at least one other probe) of the receiving end (RX+, RX−), and the receiving end (RX+, RX−). Furthermore, the impedance value of the probe tail PH3T of the at least one probe is combined with the impedance value of the upper through hole PH11H, and the impedance value of the probe tail PH3T of the at least one other probe is also combined with the impedance value of the upper through hole PH11H.

Referring to FIG. 3, when the probe device PD is in the form of a probe assembly PA, the probe device PD (probe assembly PA) includes a plurality of probes PH3'. Each of the probes PH3' is a cantilevered probe. The probe device impedance PDI is equal to the probe assembly impedance PAI. The probe assembly impedance PAI is the impedance value of the at least two probes that form a differential pair. Corresponding to aforementioned description of the probe holder impedance PHI, the probe assembly impedance PAI includes an impedance value of the probe head PH3H' of the at least one probe PH3' at the transmitting end (TX+, TX−), an impedance value of the probe body PH3B' of the at least one probe PH3' at the transmitting end (TX+, TX−), an impedance value of the probe tail PH3T' of the at least one probe PH3' at the transmitting end (TX+, TX−), an impedance value of the probe tail PH3T' of the at least one other probe PH3' at the receiving end (RX+, RX−), an impedance value of the probe body PH3B' of the at least one other probe PH3' at the receiving end (RX+, RX−), and an impedance value of the probe head PH3H' of the at least one other probe PH3' at the receiving end (RX+, RX−). For the plurality of probes PH3' of the probe assembly PA, the shapes and a segmentation of probe head, probe body, and probe tail of the probes can be adjusted according to practical requirements. Furthermore, because each of the probes PH3' of the probe assembly PA is an independent probe, regardless of how many areas are divided on the probe device for measurement, the probe assembly impedance PAI can be calculated based on the impedances of the two probes PH3' that form the differential pair.

Figure 5:
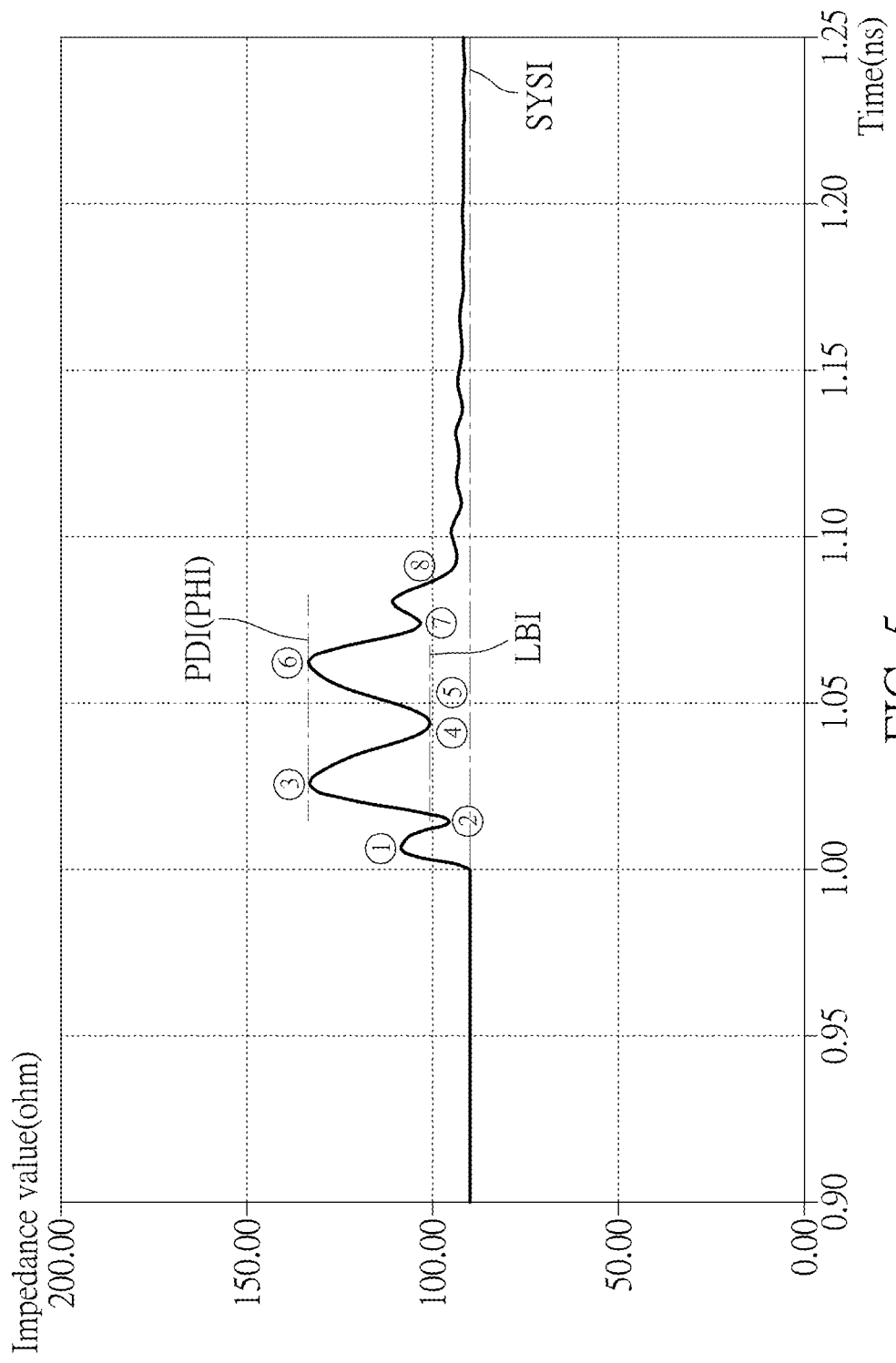
FIG. 5 is a schematic chart illustrating a simulation of a time domain reflectometry signal corresponding to impedances of various parts of the probe device (probe holder) of FIG. 4.

FIG. 5 is a schematic chart illustrating a simulation of a time domain reflectometry signal corresponding to impedances of various parts of the probe device (probe holder PH) of FIG. 4.

When a high frequency test signal passes through the probe device PD (probe holder PH) and the loopback line LBP, a corresponding signal response is shown. In this embodiment, the corresponding signal contents (impedance values) are labeled with the corresponding symbols ① to ⑧.

In this embodiment, the design of the probe card is adjusted by adjusting the loopback line impedance LBI of the loopback line LBP of the connection carrier board ST. In this example, a difference between the loopback line impedance LBI of the loopback line LBP and the probe device impedance PDI (probe holder impedance PHI) is adjusted to be less than an impedance range. The impedance range is greater than or equal to 0 ohms and less than or equal to 200 ohms. In a preferred embodiment, this impedance range is greater than or equal to 0 ohms and less than or equal to 80 ohms. Furthermore, the probe device impedance PDI (probe holder impedance PHI) on the test signal loopback path TSBP is greater than the loopback line impedance LBI on the test signal loopback path TSBP. In one example, the impedance of the loopback line LBP may be the maximum value or the average value of an impedance value of the probe body PH3B of the at least one probe PH3 at the transmitting end (TX+, TX−) (corresponding to symbol ③) and an impedance value of the probe body PH3B of the at least one other probe PH3 at the receiving end (RX+, RX−) (corresponding to symbol ⑥). The probe device impedance PDI (probe holder impedance PHI) may be the maximum value or the average value of an impedance value of the probe tail PH3T of the at least one probe PH3 at the transmitting end (TX+, TX−) (corresponding to symbol ④), an impedance value of the upper through hole PH11H through which the at least one probe PH3 passes at the transmitting end (TX+, TX−) (corresponding to symbol ④), an impedance value of the upper through hole PH11H through which the at least one other probe PH3 passes at the receiving end (RX+, RX−) (corresponding to symbol ⑤), and/or an impedance value of the probe tail PH3T of the at least one other probe PH3 at the receiving end (RX+, RX−) (corresponding to symbol ⑤).

Figure 6:
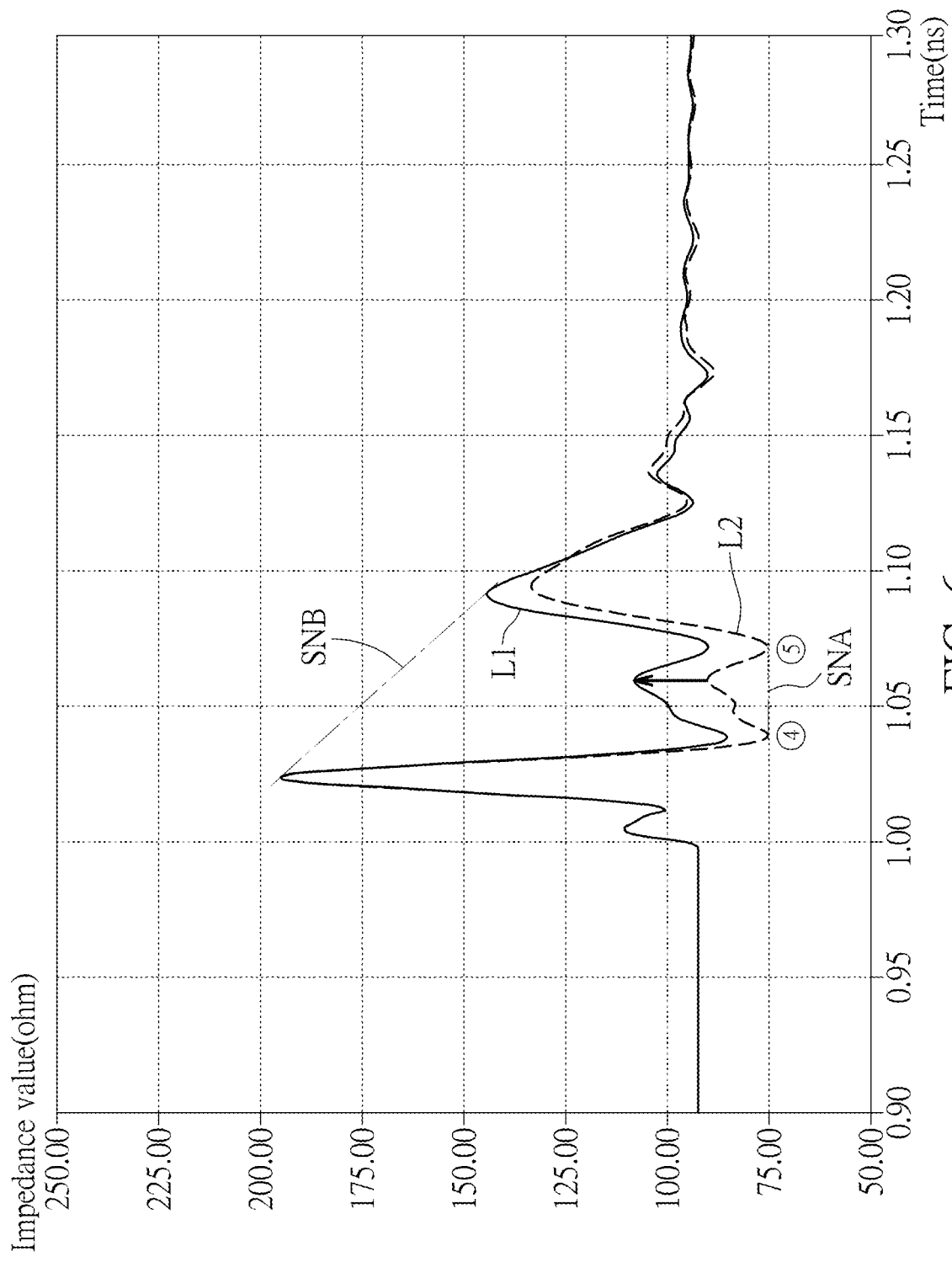
FIG. 6 is a schematic chart illustrating a simulation of a time domain reflectometry signal corresponding to impedances of various parts of the probe device (probe holder) of FIG. 4 after adjusting the probe card of the first embodiment of the present disclosure.

Referring to FIG. 6, curve L2 is the time domain reflectometry (TDR) before adjusting the impedance of the loopback line LBI. Curve L1 is the time domain reflectometry curve after the loopback line impedance LBI is adjusted. In this example, by adjusting the loopback line impedance LBI, it can be observed that in FIG. 6, the areas labeled ④ to ⑤ of curve L2 will be significantly increased to the corresponding area of curve L1. In other words, by adjusting the loopback line impedance, the impedance difference (i.e., the difference value) between segment SNA of the areas labeled ④ and ⑤ of curve L2 and segment SNB of the areas labeled ③ and ⑥ of curve L2 can be reduced. In other words, the impedance is consistent when the impedance difference (i.e., the difference value) between the connection carrier board ST and the probe device PD (probe holder PH) is reduced.

Figure 7:
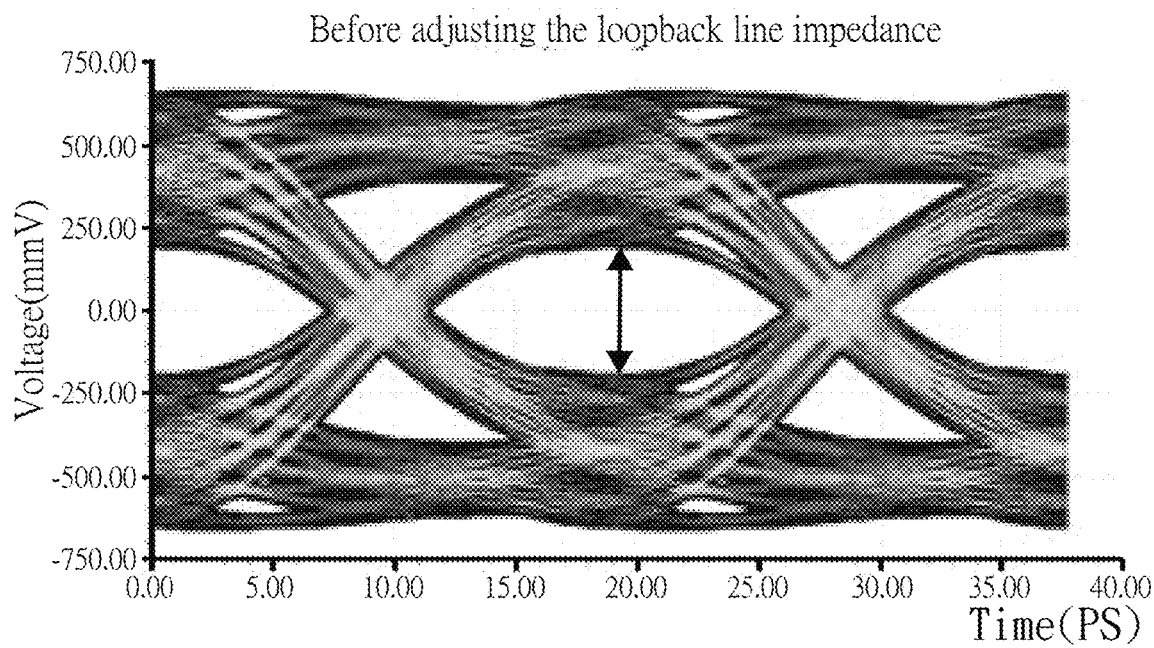
FIG. 7 is an eye diagram of a device under test being tested without a loopback line impedance of the probe device (probe holder) being adjusted.

Referring to FIG. 7 and FIG. 8, FIG. 7 is an eye diagram of a device under test being tested without a loopback line impedance of the probe device (probe holder) being adjusted (i.e., the eye diagram corresponding to curve L2 of FIG. 6), and FIG. 8 is an eye diagram of the device under test being tested after adjusting the loopback line impedance of the probe device (probe holder) (i.e., the eye diagram corresponding to curve L1 of FIG. 6). The eye height in FIG. 7 is about 378 my, and the eye height in FIG. 8 is 462 mV.

From the aforementioned two figures, it can be learned that adjusting the loopback line impedance in the loopback test signal loop (i.e., the loopback line impedance in the connection carrier board ST) to a level greater than the system impedance and close to the probe device impedance (probe holder impedance) can effectively reduce the impedance discontinuity and improve the signal integrity.

In addition, as described above, the loopback line impedance LBI on the test signal loopback path is also greater than the system impedance SYSI (>92.5Ω) of the device under test DUT. In this way, the signal integrity on the test signal loopback path TSBP is improved.

In the loopback test, when the path (TX-RX) of the loopback line of the connection carrier board ST is designed to be short, i.e., when 1/10 of a wavelength corresponding to the high frequency test signal is greater than the path length of the loopback line of the connection carrier board ST, even if the probe device impedance PDI (probe holder impedance PHI) of the probe device PD (probe holder PH) and the system impedance of the device under test DUT are mismatched, the insertion loss (IL) from the impedance mismatch does not have a significant effect on the signal integrity of the entire loopback test signal loop.

However, when the path (TX-RX) of the loopback line of the connection carrier board ST is long, if the frequency of the high frequency test signal is high (e.g., the high frequency test signal has a Nyquist frequency of 10 GHz or more), i.e., 1/10 of the wavelength of the test signal is shorter than the path of the loopback line of the connection carrier board ST, the impedance mismatch between the probe device impedance PDI (probe holder impedance PHI) and the system impedance SYSI of the device under test DUT causes line loss (e.g., an insertion loss of an S21 coefficient and a return loss of the S11 coefficient) that significantly impacts the signal integrity of the entire loopback test signal loop. In other words, when the frequency of a high frequency source is higher, the problems such as a greater noise and a signal distortion from insertion loss and return loss will be magnified. Therefore, when a reflected signal is superimposed on an original signal, a shape of the original signal will be drastically changed, and the eye height opening in the eye pattern/eye diagram in the loopback test will correspondingly be smaller. Accordingly, the signal integrity is reduced.

Figure 9:
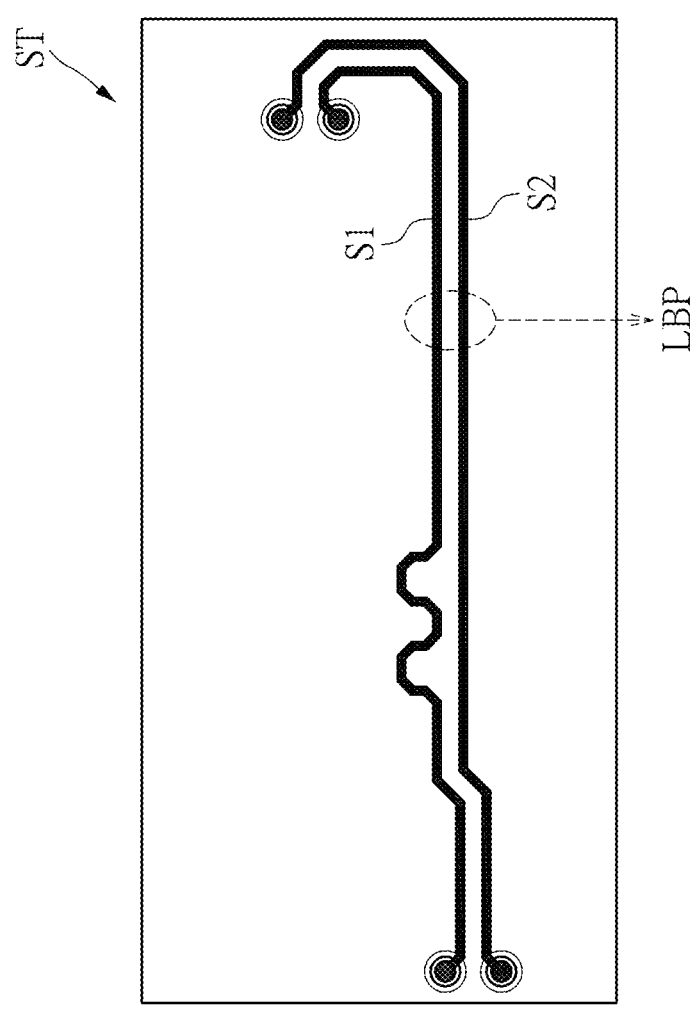
FIG. 9 is a schematic view of a loopback line in a connection carrier board ST according to the first embodiment of the present disclosure.
Figure 10:
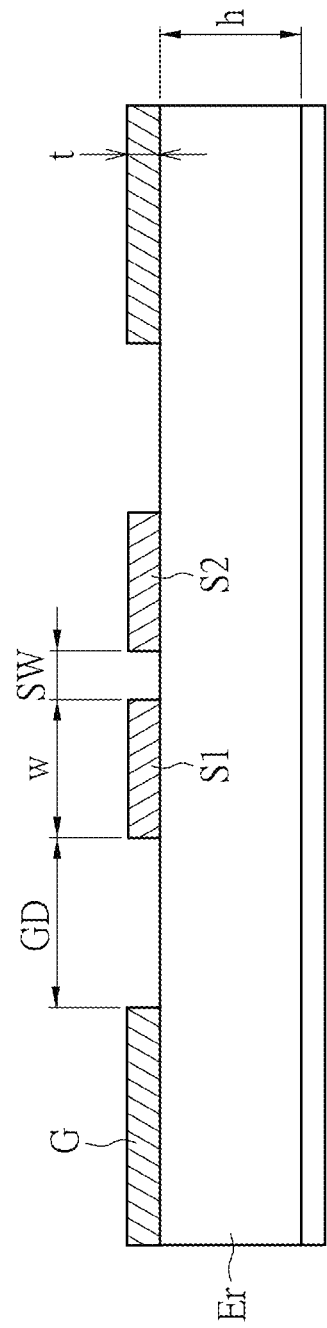
FIG. 10 is a schematic cross-sectional view of the loopback line in the connection carrier board ST according to the first embodiment of the present disclosure.

Referring to FIG. 9 and FIG. 10, FIG. 9 is a schematic view of a loopback line in a connection carrier board ST according to the first embodiment of the present disclosure, and FIG. 10 is a schematic cross-sectional view of the loopback line in the connection carrier board ST according to the first embodiment of the present disclosure.

The adjustment of the loopback line impedance LBI can be performed through relevant parameters. Referring to FIG. 10, the connection carrier board ST further includes a ground potential circuit G on one side of the loopback line LBP. As mentioned above, the loopback line LBP is a differential pair (as shown in FIG. 9). Accordingly, the loopback line LBP includes a first line 51 and a second line S2, and a distance between the first line 51 and the second line S2 is a wiring distance SW, a width of the line of the first line 51 or the second line S2 is a line width w, and a thickness of the conductor disposed on the first line 51 and the second line S2 is the conductor thickness t. A distance between the loopback line LBP and the ground potential line G is a distance GD.

The loopback line impedance LBI of the loopback line LBP is determined by one or a combination of multiple parameters. The multiple parameters that determine the loopback line impedance LBI include the parameters of both the loopback line LBP and the connection carrier board ST.

The parameters of the loopback line LBP include: a line width w of the loopback line LBP, a wiring distance SW of the loopback line LBP, a conductor thickness t of the loopback line LBP, and a distance GD between the loopback line LBP and the ground potential line G.

The parameters of the connection carrier board ST include: a guide plate thickness h of the connection carrier board ST and a dielectric constant (Er=Dk) of the connection carrier board ST.

Furthermore, the loopback line impedance LBI can be calculated according to the following equations:

$$Z = \sqrt{\frac{L}{C}}, \quad \text{Equation (1)}$$

in which the capacitance C can be calculated by the following Equation (2); and $$C = \varepsilon * \frac{A}{d}. \quad \text{Equation (2)}$$

In Equation (1), Z is the loopback line impedance LBI, L is the inductance of the loopback line LBP, and C is the capacitance generated by the loopback line LBP. In this embodiment, the conductor thickness t and the line width W can determine a guide plate area A. The guide plate thickness h, the wiring distance SW, and the distance GD between the loopback line LBP and the ground potential line G can determine a guide plate pitch d in the above Equation (2).

For example, when the line width W becomes smaller, it can be regarded as the guide plate area A in Equation (2) becoming smaller. That is, the capacitance C becomes smaller, and therefore the impedance Z becomes greater.

In another example, when the wiring distance SW becomes wider, it can be regarded as the guide plate pitch d in Equation (2) becoming greater. In other words, the capacitance C becomes smaller, such that the impedance Z becomes greater. Based on the above examples, a user can adjust the above parameters according to the practical requirements to achieve the effect of adjusting the loopback line impedance LBI.

Second Embodiment

Figure 11:
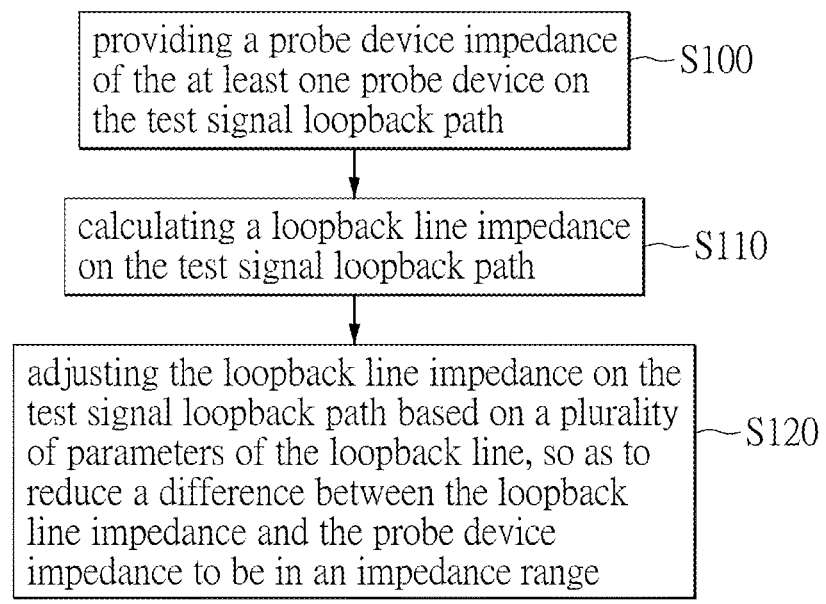
FIG. 11 is a flowchart of a method for designing a probe card according to a second embodiment of the present disclosure.
Figure 12:
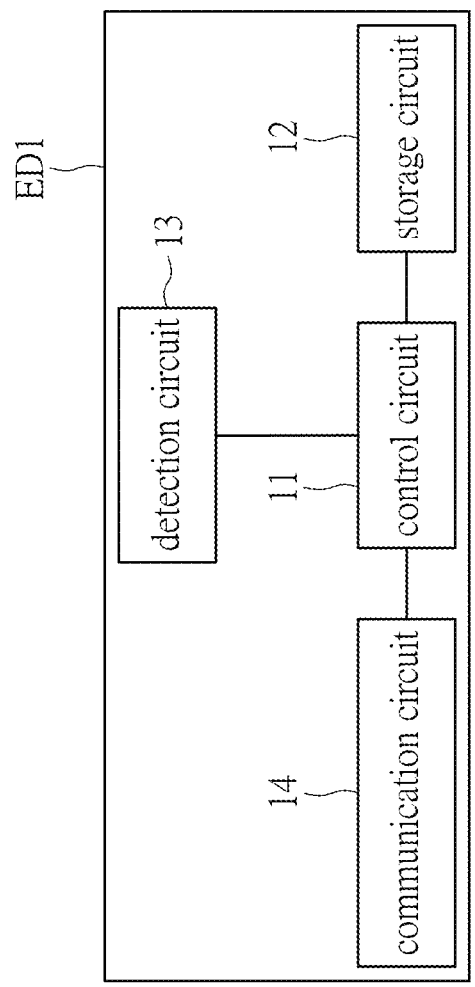
FIG. 12 is a functional block diagram of an electronic device designed by using the method for designing a probe card according to the second embodiment of the present disclosure.

Referring to FIG. 11 and FIG. 12, FIG. 11 is a flowchart of a method for designing a probe card according to a second embodiment of the present disclosure, and FIG. 12 is a functional block diagram of an electronic device designed by using the method for designing a probe card according to the second embodiment of the present disclosure.

FIG. 11 is a flowchart of the method for designing a probe card for a high frequency test according to the second embodiment of the present disclosure. The probe card design method of this embodiment is applicable to the probe card PC of the first embodiment, particularly a vertical probe card. That is, a probe card manufactured using the probe card design method of this embodiment has a structure similar to that of the probe card PC of the first embodiment, and will not be repeated herein in terms of structure and function.

In addition, the method of designing a probe card for the high frequency test is applicable to an electronic device ED1. The electronic device ED1 can be calculated and designed based on multiple parameters of the probe card PC. The electronic device ED1 includes a control circuit 11, a storage circuit 12, a detection circuit 13, and a communication circuit 14. The control circuit 11 is electrically connected to the storage circuit 12, the detection circuit 13, and the communication circuit 14.

A method for designing a probe card for high frequency tests is applicable to a device under test DUT and a probe card PC. The probe card PC at least includes a wiring substrate PCB, a connection carrier board ST, and a probe device PD. The connection carrier board ST includes a loopback line LBP. The probe device PD includes a plurality of probes PH3, and at least two of the plurality of probes PH3 are connected to two sides of the loopback line LBP to form a test signal loopback path TSBP. The device under test DUT undergoes a loopback test at least through the probe card PC. The method for designing a probe card includes the following steps:

Step S100: providing a probe device impedance (PDI) of the at least one probe device (PD) on the test signal loopback path;

Step S110: calculating a loopback line impedance on the test signal loopback path; and Step S120: adjusting the loopback line impedance on the test signal loopback path based on a plurality of parameters of the loopback line to reduce a difference between the loopback line impedance (LBI) and the probe device impedance PDI (probe holder impedance PHI or probe assembly impedance PAI) to be in an impedance range.

In step S100, the voltage and current that are input into and output from the device under test DUT are detected by the control circuit 11 and the detection circuit 13 of the electronic device ED1. Next, the control circuit 11 calculates a probe device impedance PDI (probe holder impedance PHI or probe assembly impedance PAI) of the probe device (PD) on the test signal loopback path TSBP. In addition, the control circuit 11 calculates the system impedance SYSI of the device under test DUT.

Furthermore, the control circuit 11 stores the system impedance SYSI of the device under test DUT and the probe device impedance PDI (probe holder impedance PHI or probe assembly impedance PAI) in the storage circuit 12 of the electronic device ED1. In this embodiment, the system impedance SYSI of the device under test DUT is exemplarily between 85 ohms and 100 ohms. In other embodiments, the system impedance SYSI of the device under test DUT may be adjusted according to practical conditions.

In step S110 and step S120, the control circuit 11 of the electronic device ED1 further detects and calculates the loopback line impedance LBI on the test signal loopback path TSBP. In addition, the control circuit 11 also detects the system impedance SYSI of the device under test DUT.

At least two probes PH3 of the plurality of probes PH3 of the probe device PD form a differential pair. The differential pair is electrically connected to a loopback line LBP in the connection carrier board ST to form a test signal loopback path.

The device under test DUT undergoes the loopback test at least through the probe card PC. The loopback test uses a high-frequency test signal provided by the device under test DUT, the signal passes through the at least one probe (TX+, TX−) of the aforementioned differential pair, the probe device PD, the loopback line LBP of the connection carrier board ST, and the at least one other probe (RX+, RX−), and is then transmitted back to the device under test DUT for testing the device under test DUT. The loopback line LBP is connected between a probe tail PH3T of the at least one probe PH3 and a probe tail PH3T of the at least one other probe PH3.

Therefore, the control circuit 11 and the detection circuit 13 of the electronic device ED1 detect the loopback line impedance LBI on the test signal loopback path.

The test signal loopback path TSBP includes a transmitting end TX of the device under test DUT for transmitting a high frequency test signal, a probe PH3 (the at least one probe) that contacts the transmitting end TX, a loopback line LBP of the connection carrier board ST, a probe PH3 (the at least one other probe) at a receiving end RX, and the receiving end RX that contacts the probe PH3 at the receiving end.

That is, the detection circuit 13 can perform impedance detection in various regions on the test signal loopback path TSBP. The loopback line impedance LBI (as shown in FIG. 2) is the impedance of the loopback line LBP disposed in the connection carrier board ST. In addition, the detection circuit 13 can perform a loopback test based on a high frequency test signal. The probe device PD has a probe device impedance PDI (probe holder impedance PHI) on the test signal loopback path (as shown in FIG. 2).

The probe device PD is described herein in the form of the probe holder PH. The probe holder impedance PHI includes an impedance value of the probe head PH3H of the at least one probe PH3 at the transmitting end (TX+, TX−) (corresponding to symbol ①), an impedance value of the lower through hole PH21H through which the at least one probe PH3 passes at the transmitting end (TX+, TX−) (corresponding to symbol ②), an impedance value of the probe body PH3B of the at least one probe PH3 at the transmitting end (TX+, TX−) (corresponding to symbol ③), an impedance value of the probe tail PH3T of the at least one probe PH3 at the transmitting end (TX+, TX−) (corresponding to symbol ④), an impedance value of the upper through hole PH11H through which the at least one probe PH3 passes at the transmitting end (TX+, TX−) (corresponding to symbol ④), an impedance value of the upper through hole PH11H through which the at least one other probe PH3 passes at the receiving end (RX+, RX−) (corresponding to symbol ⑤), an impedance value of the probe tail PH3T of the at least one other probe PH3 at the receiving end (RX+, RX−) (corresponding to symbol ⑤), an impedance value of the probe body PH3B of the at least one other probe PH3 at the receiving end (RX+, RX−) (corresponding to symbol ⑥), an impedance value of the lower through hole PH21H through which the at least one other probe PH3 passes at the receiving end (RX+, RX−) (corresponding to symbol ⑦), and an impedance value of the probe head PH3H of the at least one other probe PH3 at the receiving end (RX+, RX−) (corresponding to symbol ⑧). The sequence of the description is described in terms of the test signal loopback path TSBP including the high frequency test signal passing from the transmitting end (TX+, TX−) through the probe PH3 (the at least one probe) of the transmitting end (TX+, TX−), the loopback line LBP, the probe PH3 (the at least one other probe) of the receiving end (RX+, RX−), and the receiving end (RX+, RX−). Furthermore, the impedance value of the probe tail PH3T of the at least one probe is combined with the impedance value of the upper through hole PH11H, and the impedance value of the probe tail PH3T of the at least one other probe is also combined with the impedance value of the upper through hole PH11H.

In addition, when the probe device PD is in the form of the probe assembly PA, the probe assembly impedance PAI of the probe assembly PA is as described in the first embodiment, and is not described herein.

In step S120, the control circuit 11 and the detection circuit 13 detect the loopback line impedance LBI. The control circuit 11 then adjusts the loopback line impedance LBI on the test signal loopback path TSBP according to the plurality of parameters of the loopback line LBP.

That is, as shown in FIG. 5, the control circuit 11 increases the loopback line impedance according to the plurality of parameters, and continues to increase the loopback line impedance LBI to be greater than the system impedance SYSI of the device under test DUT, so as to reduce an impedance difference between the loopback line impedance LBI and the probe device impedance PDI. Next, the control circuit 11 further determines whether or not the difference between the loopback line impedance LBI and the probe device impedance PDI (probe holder impedance PHI) is within an impedance range. The impedance range is, for example, greater than 0 ohms and less than 200 ohms, and preferably greater than 0 ohms and less than 80 ohms.

Furthermore, the control circuit 11 confirms that the probe device impedance PDI on the test signal loopback path TSBP is greater than the loopback line impedance LBI on the test signal loopback path TSBP.

When the control circuit 11 detects that the difference between the loopback line impedance LBI and the probe device impedance PDI (probe holder impedance PHI) is between impedance regions, the control circuit 11 continues with the subsequent design steps.

When the control circuit 11 detects that the difference between the loopback line impedance LBI and the probe device impedance PDI (probe holder impedance PHI) is not in the impedance range, the control circuit 11 sends a notification signal via the communication circuit 14 for adjusting the loopback line impedance LBI.

Further, the control circuit 11 detects a path length of the loopback line LBP and determines whether or not the path length of the loopback line LBP is greater than or equal to a predetermined length value, the predefined length value being 700 μm.

Next, the control circuit 11 detects a pitch between the two probes of the differential pair. The control circuit 11 then determines whether or not the path length of the loopback line LBP is greater than five times the pitch of the at least two probes (i.e., the differential pair).

In addition, according to the aforementioned Equation (1) and Equation (2) and the parameters related to the loopback line impedance LBI of the loopback line LBP, the control circuit 11 provides suggestions regarding the action of adjusting the loopback line impedance LBI.

As mentioned above, the control circuit 11 adjusts the impedance value of the loopback line impedance LBI based on the plurality of parameters of the loopback line impedance LBI. Furthermore, the loopback line impedance LBI of the loopback line LBP is determined based on one or a combination of the aforementioned plurality of parameters. The plurality of parameters for determining the loopback line impedance LBI include parameters of both the loopback line LBP and the connection carrier board ST.

The parameters of the loopback line LBP include: a line width w of the loopback line LBP, a wiring distance SW of the loopback line LBP, a conductor thickness t of the loopback line LBP, and a distance GD between the loopback line LBP and the ground potential line G.

The parameters of the connecting carrier board ST include: a guide plate thickness h of the connection carrier board ST and a dielectric constant (Er=Dk) of the connection carrier board ST.

Furthermore, the loopback line impedance LBI can be calculated according to Equation (1) and Equation (2) of the first embodiment, and will not be iterated herein.

For example, when the line width W becomes thicker, it can be regarded as the area A of the guide plate in Equation (2) becoming greater. In other words, the capacitance C becomes greater, and therefore the impedance Z becomes smaller.

In another example, when the wiring distance SW becomes narrower, it can be regarded as the guide plate pitch d in Equation (2) becoming smaller. In other words, the capacitance C becomes greater such that the impedance Z becomes smaller. Based on the above example, the user can adjust the above parameters according to the practical requirements to achieve the effect of adjusting the loopback line impedance LBI in this embodiment.

In this embodiment, the high frequency test signal has a Nyquist frequency of greater than or equal to 10 GHz.

Third Embodiment

Figure 13:
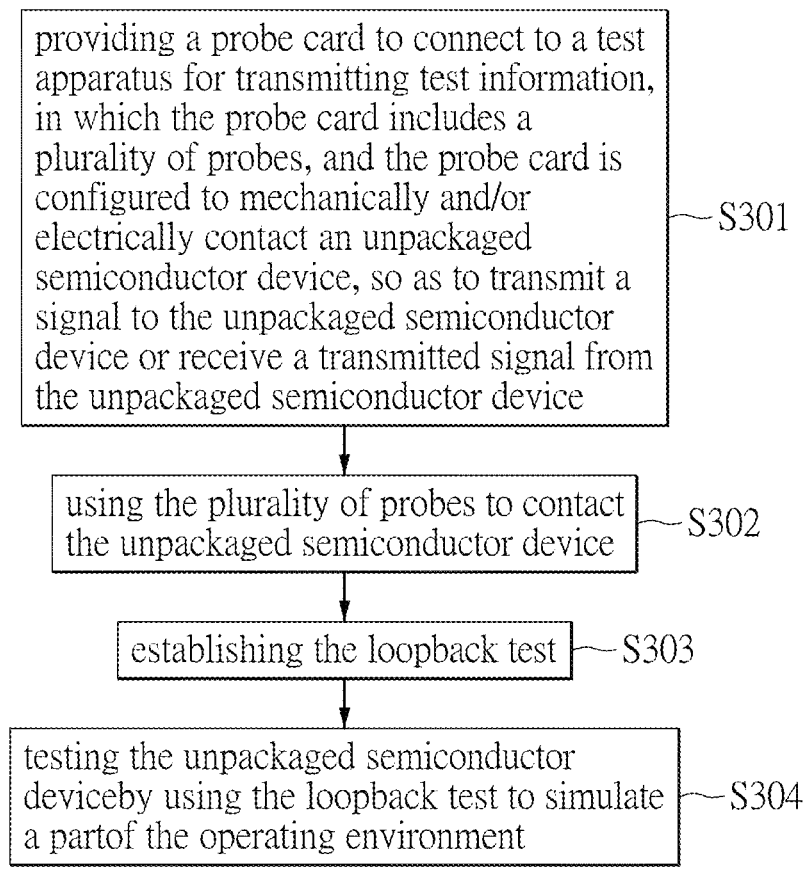
FIG. 13 is a flowchart of a method for producing at least one tested semiconductor device and a method for testing an unpackaged semiconductor device by a probe card according to a third embodiment of the present disclosure.

FIG. 13 is a flowchart of a method for producing at least one tested semiconductor device and a method for testing an unpackaged semiconductor device by a probe card (PC) according to a third embodiment of the present disclosure.

In this embodiment, a method of producing a tested semiconductor device and a method of testing an unpackaged semiconductor device by a probe card (PC) are provided. The semiconductor device of both methods is designed to be used in an operating environment. Since both methods are in a same stage and testing process in a manufacturing process, both methods can be described using the same process. A method of producing a tested semiconductor device and a method of testing an unpackaged semiconductor device by a probe card (PC) include the following steps:

Step S301: providing a probe card PC for connecting to a test apparatus for transmitting test information, the probe card PC includes a plurality of probes (PH3), and the probe card PC is configured to mechanically and/or electrically contact an unpackaged semiconductor device so as to transmit a signal to the unpackaged semiconductor device or to receive a transmitted signal from the unpackaged semiconductor device; Step S302: using the plurality of probes to contact the unpackaged semiconductor device;

Step S303: establishing the loopback test; and

Step S304: testing the unpackaged semiconductor device using the loopback test to simulate a part of the operating environment.

In step S301 and step S302, the unpackaged semiconductor device is the device under test DUT of the first embodiment and the second embodiment. The structure and function of the probe card PC of the this embodiment are the same as those of the probe card of the first embodiment or of the probe card designed utilizing the method for designing the probe card of the second embodiment, and will not be repeated herein.

Further, in steps S303 and S304, the loopback test is a high frequency test, a process of the loopback test is as described in the previous embodiments, and a test frequency of the loopback test is greater than or equal to 10 GHz.

In addition, the loopback test is used to test an unpackaged semiconductor device to simulate a part of the operating environment. That is, the device under test DUT sends out a high frequency test signal to perform the loopback test.

Fourth Embodiment

Figure 14:
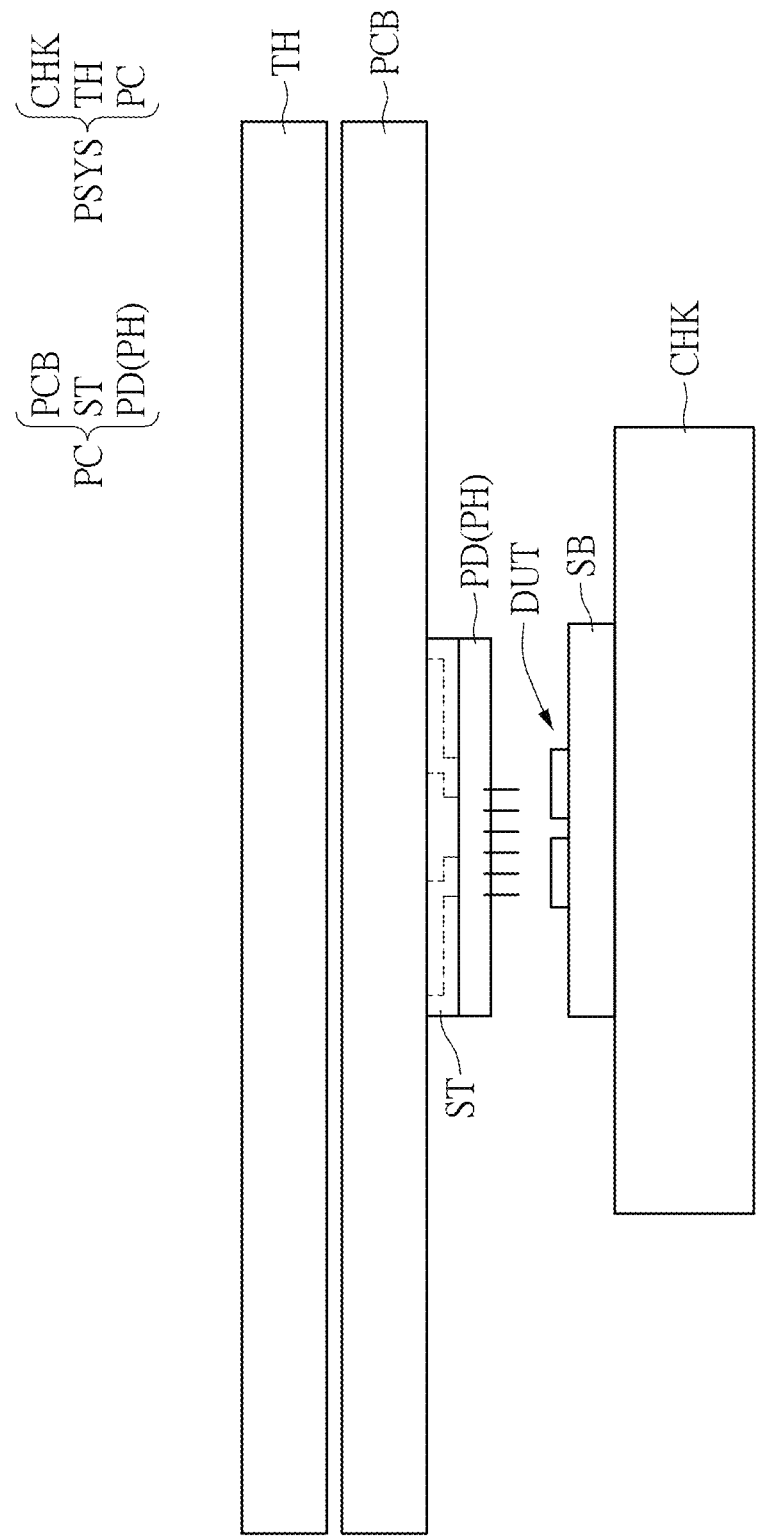
FIG. 14 is a schematic view of a probe system according to a fourth embodiment of the present disclosure.

Referring to FIG. 14, FIG. 14 is a schematic diagram of a probe system according to a fourth embodiment of the present disclosure. In this embodiment, a probe system PSYS is provided for testing a device under test DUT formed on a substrate SB.

The probe system PSYS includes a carrier device CHK, a test apparatus TH, and a probe card PC. The carrier device CHK is configured to support the substrate SB, and the test apparatus TH is configured to be electrically connected to the device under test DUT to establish a loopback test program. The probe card PC in this embodiment is then mechanically and/or electrically disposed in the test apparatus TH.

The probe card PC in this embodiment is a probe card PC designed using the probe card of the first embodiment and the method for designing the probe card of the second embodiment, and therefore the structure and function of the probe card PC is not described herein. Similarly, the device under test DUT is a semiconductor device formed on a substrate in the same manner as the devices under test DUT of the first and second embodiments, and is therefore not described herein. Furthermore, when performing the loopback test, the probe system PSYS is capable of obtaining improved signal integrity under high frequency test signal conditions (e.g., test signal frequency higher than 10 GHz).

Beneficial Effects of the Embodiments

In conclusion, in the probe card provided by the present disclosure, by adjusting the loopback line in the connection carrier board (i.e., the space transformer), an impact of the impedance mismatch in the loopback test can be effectively reduced. Moreover, in a high frequency test, through adjusting the loopback line in the connection carrier board, the impedance matching of the connection carrier board and the probe device can be improved, such that signal integrity in the loopback test can be effectively improved while ensuring flexibility in designing the probe card.

For example, the probe device PD of the present disclosure can be exemplified by a probe holder PH or a probe assembly PA. According to certain embodiments, the probe device PD can include a plurality of probe assemblies PA or a plurality of probe holders PH, and a quantity of the probe assemblies PA and the probe holders PH can be adjusted according to practical requirements. For example, a quantity of the probe assemblies PA can be two or four, and a quantity of the probe holders PH can be two or four. Furthermore, the aforementioned plurality of probe assemblies PA and the plurality of probe holders PH both include at least one differential pair. According to certain embodiments, the plurality of probe assemblies PA can have only one probe assembly PA that includes at least one differential pair, or the plurality of probe holders PH can have only one probe holder PH that includes at least one differential pair. In some cases, numbers of differential pairs in each of the plurality of probe assemblies PA and numbers of differential pairs in each of the plurality of probe holders PH are the same, or numbers of differential pairs in each of the plurality of probe assemblies PA and numbers of differential pairs in each of the plurality of probe holders PH are different.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A probe card for testing at least one device under test being formed on a substrate, the at least one device under test having a system impedance, and a loopback test being performed on the device under test, wherein the probe card comprises:
    a wiring substrate having a wafer side and a tester side, wherein the wafer side of the wiring substrate and the tester side of the wiring substrate are disposed opposite to each other, and the tester side of the wiring substrate is provided for connecting to a test apparatus;
    a connection carrier board having a wafer side and a tester side, wherein the connection carrier board includes at least one loopback path that is disposed in the connection carrier board, and the tester side of the connection carrier board is connected to the wafer side of the wiring substrate; and
    at least one probe device, wherein the at least one probe device is connected to the wafer side of the connection carrier board, and each of the at least one probe device includes:
        a plurality of probes;
    wherein one end of each of the plurality of probes is electrically connected to the connection carrier board, and another end of each of the probe is in electrical contact with the device under test;
    wherein at least two of the plurality of probes of the at least one probe device form a differential pair, and the differential pair is electrically connected to the loopback line in the connection carrier board to form a test signal loopback path;
    wherein the at least one probe device has a probe device impedance on the test signal loopback path, the loopback line has a loopback line impedance on the test signal loopback path, a difference between the probe device impedance on the test signal loopback path and the loopback line impedance on the test signal loopback path is in an impedance range, and the loopback line impedance on the test signal loopback path is greater than the system impedance of the device under test.

2. The probe card according to claim 1, wherein the impedance range is between 0 ohms and 200 ohms.

3. The probe card according to claim 1, wherein the probe device impedance on the test signal loopback path is greater than the loopback line impedance on the test signal loopback path.

4. The probe card according to claim 1, wherein the loopback test utilizes a high frequency test signal provided by the device under test, the high frequency test signal passes through at least one probe, the probe device, the loopback line of the connection carrier board, and at least one other probe, and the high frequency test signal is then transferred back to the device under test for testing the device under test; wherein the loopback line is connected between probe tails of the at least one probe and the at least one other probe.

5. The probe card according to claim 4, wherein the high frequency test signal has a Nyquist frequency of greater than or equal to 10 GHz, the loopback line has a path length greater than or equal to a predetermined length value, the predetermined length value being 700 μm, the path length of the loopback line is greater than 1/10 of a wavelength corresponding to the high frequency test signal, and a probe length of each of the probes is greater than or equal to 3 mm.

6. The probe card according to claim 5, wherein, when the probe device is in the form of a probe holder, the probe device further includes:
   an upper guide plate member including at least one upper guide plate, wherein the at least one upper guide plate has a plurality of upper through holes formed thereon; and
   a lower guide plate member including at least one lower guide plate, wherein the at least one lower guide plate has a plurality of lower through holes formed thereon, and the upper guide plate member and the lower guide plate member are disposed opposite to each other;
   wherein each of the probes passes through one of the plurality of upper through holes and one of the plurality of lower through holes;
   wherein each of the probes further has a probe head and a probe body located between the probe tail and the probe head;
   wherein the probe tail of each of the probes passes through the upper through hole of the upper guide plate member to be electrically connected to the connection carrier board, and the probe head of each of the probes is configured to be in electrical contact with the device under test;
   wherein the probe device impedance includes an impedance value of the probe head of the at least one probe, an impedance value of the probe body of the at least one probe, an impedance value of the probe tail of the at least one probe, an impedance value of the probe head of the at least one other probe, an impedance value of the probe body of the at least one other probe, an impedance value of the probe tail of the at least one other probe, an impedance value of the upper through hole through which the at least one probe passes, an impedance value of the lower through hole through which the at least one probe passes, an impedance value of the upper through hole through which the at least one other probe passes, and an impedance value of the lower through hole through which the at least one other probe passes.

7. The probe card according to claim 5, wherein, when the probe device is in the form of a probe assembly, each of the probes in the probe device is a cantilevered probe, and the probe device impedance includes an impedance value of a probe head of the at least one probe, an impedance value of a probe body of the at least one probe, an impedance value of the probe tail of the at least one probe, an impedance value of a probe head of the at least one other probe, an impedance value of a probe body of the at least one other probe, and an impedance value of the probe tail of the at least one other probe.

8. The probe card according to claim 5, wherein, in the at least two probes that form the differential pair, the at least two probes have a pitch therebetween, and the path length of the loopback line is greater than five times a length of the pitch between the at least two probes.

9. The probe card of claim 8, wherein the connection carrier board further includes a ground potential line provided on one side of the loopback line, the loopback line impedance of the loopback line is determined according to one or a combination of a plurality of parameters including a width of the loopback line, a wiring distance of the loopback line, a conductor thickness of the loopback line, a distance between the loopback line and the ground potential line, a dielectric constant of the connection carrier board of the loopback line, or a guide plate thickness of the connection carrier board.

10. A method for producing at least one tested semiconductor device being designed for use in an operating environment, and the method including:
   providing the probe card as claimed in claim 1 to connect to a test apparatus for transmitting test information, wherein the probe card includes a plurality of probes, and the probe card is configured to mechanically and/or electrically contact an unpackaged semiconductor device, so as to transmit a signal to the unpackaged semiconductor device or receive a transmitted signal from the unpackaged semiconductor device;
   using the plurality of probes to contact the unpackaged semiconductor device;
   establishing the loopback test; and
   testing the unpackaged semiconductor device by using the loopback test to simulate a part of the operating environment.

11. A method for testing an unpackaged semiconductor device by a probe card, the unpackaged semiconductor device being designed for use in an operating environment, and the method including:
   providing the probe card as claimed in claim 1 to connect to a test apparatus for transmitting test information, wherein the probe card includes a plurality of probes, and the probe card is configured to mechanically and/or electrically contact the unpackaged semiconductor device, so as to transmit a signal to the unpackaged semiconductor device or receive a transmitted signal from the unpackaged semiconductor device;
   using the plurality of probes to contact the unpackaged semiconductor device;
   establishing the loopback test; and
   testing the unpackaged semiconductor device by using the loopback test to simulate a part of the operating environment.

12. A device under test, wherein the device under test performs a high frequency test using the probe card as claimed in claim 1, wherein the high frequency test is performed by using a high frequency signal, wherein the high frequency signal has a Nyquist frequency greater than or equal to 10 GHz, and the high frequency test is the loopback test.

13. A probe system for testing a device under test formed on a substrate, including:
   a carrier device being configured to support the substrate;
   a test apparatus being configured to be electrically connected to the device under test to establish a loopback test; and
   a probe card being mechanically and/or electrically disposed in the test apparatus;
   wherein the probe card utilizes the probe card as claimed in claim 1;
   wherein the loopback test is a high frequency test.

14. A method for designing a probe card for high frequency tests and applicable to at least one device under test and a probe card, wherein the probe card at least includes a wiring substrate, a connection carrier board, and at least one probe device; wherein the connection carrier board includes a loopback line, the at least one probe device includes a plurality of probes, and at least two probes of the at least one probe device are respectively connected to two sides of the loopback line to form a test signal loopback path; wherein the at least one device under test at least performs a loopback test through the probe card, and wherein the method comprises:
- providing a probe device impedance of the at least one probe device on the test signal loopback path;
- calculating a loopback line impedance on the test signal loopback path; and
- adjusting the loopback line impedance on the test signal loopback path based on a plurality of parameters of the loopback line, so as to reduce a difference between the loopback line impedance and the probe device impedance to be in an impedance range.

15. The method according to claim 14, wherein the loopback line impedance is increased to be greater than a system impedance of the at least one device under test to reduce an impedance difference between the loopback line impedance and the probe device impedance, and the probe device impedance on the test signal loopback path is greater than the loopback line impedance on the test signal loopback path.

16. The method according to claim 15, wherein the impedance range is between 0 ohms and 200 ohms.

17. The method according to claim 16, wherein, when the probe device is in the form of a probe holder, the probe device further includes:
- an upper guide plate member including at least one upper guide plate, wherein the at least one upper guide plate has a plurality of upper through holes formed thereon; and
- a lower guide plate member including at least one lower guide plate, wherein the at least one lower guide plate has a plurality of lower through holes formed thereon, and the upper guide plate member and the lower guide plate member are disposed opposite to each other;
- wherein each of the probes passes through one of the plurality of upper through holes and one of the plurality of lower through holes;
- wherein each of the probes further has a probe head and a probe body located between the probe tail and the probe head, and the probe tail of each of the probes passes through one of the upper through holes of the upper guide plate member to be electrically connected to the connection carrier board;
- wherein the probe device impedance includes an impedance value of the probe head of the at least one probe, an impedance value of the probe body of the at least one probe, an impedance value of the probe tail of the at least one probe, an impedance value of the probe head of the at least one other probe, an impedance value of the probe body of the at least one other probe, an impedance value of the probe tail of the at least one other probe, an impedance value of the upper through hole through which the at least one probe passes, an impedance value of the lower through hole through which the at least one probe passes, an impedance value of the upper through hole through which the at least one other probe passes, and an impedance value of the lower through hole through which the at least one other probe passes.

18. The method according to claim 16, wherein, when the probe device is in the form of a probe assembly, each of the probes in the probe device is a cantilevered probe, and the probe device impedance includes an impedance value of a probe head of the at least one probe, an impedance value of a probe body of the at least one probe, an impedance value of the probe tail of the at least one probe, an impedance value of a probe head of the at least one other probe, an impedance value of a probe body of the at least one other probe, and an impedance value of the probe tail of the at least one other probe.

19. The method according to claim 17, wherein the loopback test utilizes a high frequency test signal provided by the at least one device under test, the high frequency test signal passes through the at least one probe, the probe device, the loopback line of the connection carrier board, and the at least one other probe, and the high frequency test signal is then transferred back to the device under test for testing the device under test; wherein the loopback line is connected between the at least one probe and the at least one other probe;
- wherein the high frequency test signal has a Nyquist frequency of greater than or equal to 10 GHz, the loopback line has a path length greater than or equal to a predetermined length value, the predetermined length value being 700 μm, and the path length of the loopback line is greater than 1/10 of a wavelength corresponding to the high frequency test signal.

20. The method according to claim 19, wherein at least two probes form a differential pair, the at least two probes have a pitch therebetween, and the path length of the loopback line is greater than five times a length of the pitch between the at least two probes, and wherein a probe length of each of the probes is greater than or equal to 3 mm;
- wherein the connection carrier board further includes a ground potential line provided on one side of the loopback line; wherein a plurality of parameters of the loopback line impedance of the loopback line include a width of the loopback line, a wiring distance of the loopback line, a conductor thickness of the loopback line, a distance between the loopback line and the ground potential line, a dielectric constant of the connection carrier board of the loopback line, or a guide plate thickness of the connection carrier board; wherein the loopback line impedance is determined by one of the plurality of parameters or by a combination of two or more of the plurality of parameters.

* * * * *